United States Patent [19]
Beer et al.

[11] Patent Number: 4,996,483
[45] Date of Patent: Feb. 26, 1991

[54] SPINNING ANGLE OPTICAL CALIBRATION APPARATUS

[75] Inventors: Stephen K. Beer; Harold R. Pratt, II, both of Morgantown, W. Va.

[73] Assignee: The United States of America as represented by the United States Department of Energy, Washington, D.C.

[21] Appl. No.: 406,004

[22] Filed: Sep. 12, 1989

[51] Int. Cl.⁵ .............................................. G01R 33/20
[52] U.S. Cl. ...................................... 324/321; 356/140
[58] Field of Search ............... 324/300, 307, 304, 301, 324/309, 318, 321, 322; 356/140, 142, 143, 154

[56] References Cited

U.S. PATENT DOCUMENTS

| | | | |
|---|---|---|---|
| 4,275,350 | 6/1981 | Hill et al. | 324/321 |
| 4,352,066 | 9/1982 | Kendrick | 324/321 |
| 4,450,407 | 5/1984 | Kwon | 324/300 |
| 4,511,841 | 4/1985 | Bartaska | 324/321 |
| 4,899,111 | 2/1990 | Pines | 324/321 |

Primary Examiner—Michael J. Tokar
Attorney, Agent, or Firm—David E. Breeden; Stephen D. Hamel; William R. Moser

[57] ABSTRACT

An optical calibration apparatus is provided for calibrating and reproducing spinning angles in cross-polarization, nuclear magnetic resonance spectroscopy. An illuminated magnifying apparatus enables optical setting an accurate reproducing of spinning "magic angles" in cross-polarization, nuclear magnetic resonance spectroscopy experiments. A reference mark scribed on an edge of a spinning angle test sample holder is illuminated by a light source and viewed through a magnifying scope. When the "magic angle" of a sample material used as a standard is attained by varying the angular position of the sample holder, the coordinate position of the reference mark relative to a graduation or graduations on a reticle in the magnifying scope is noted. Thereafter, the spinning "magic angle" of a test material having similar nuclear properties to the standard is attained by returning the sample holder back to the originally noted coordinate position.

16 Claims, 2 Drawing Sheets

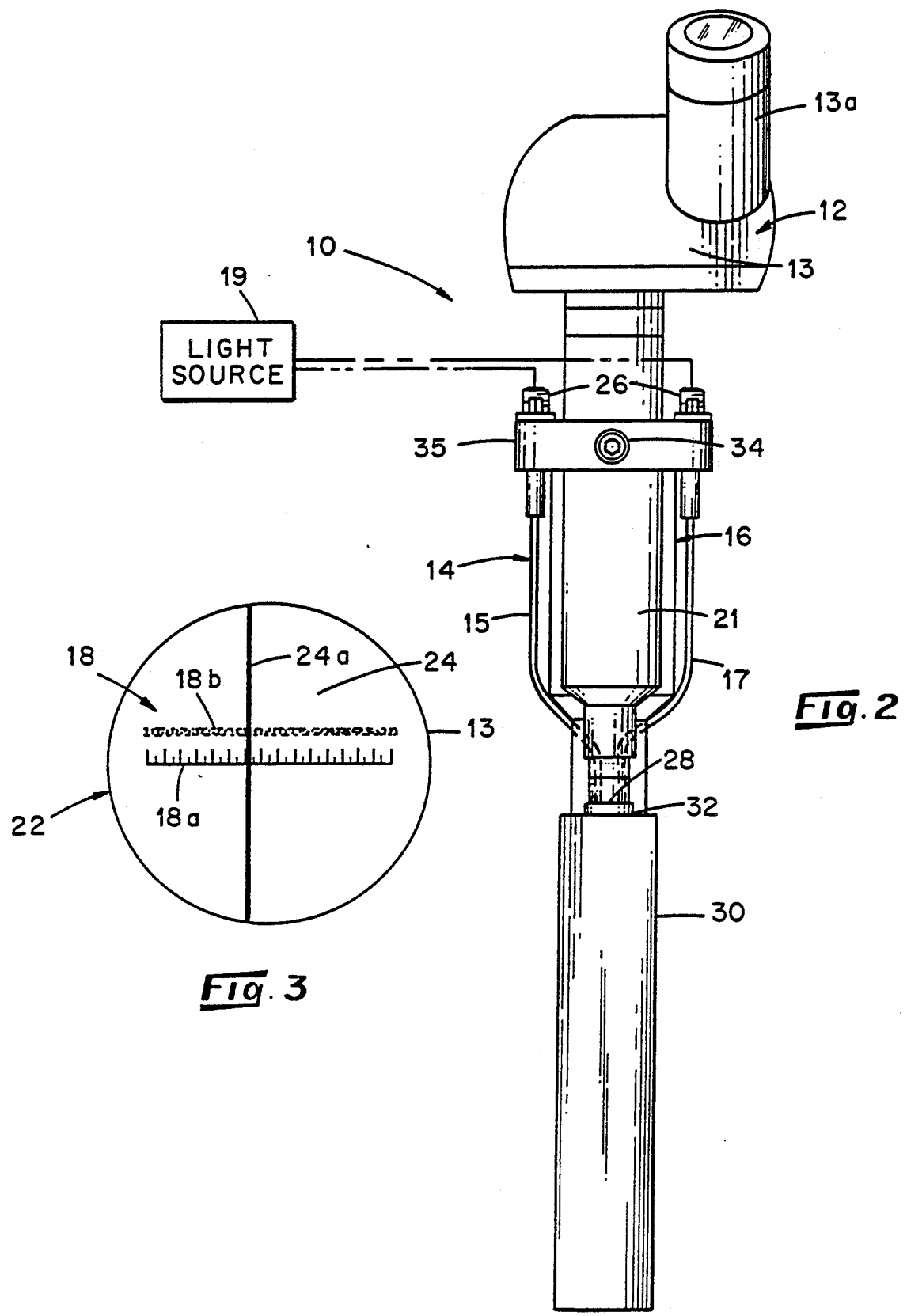

SPINNING ANGLE OPTICAL CALIBRATION APPARATUS

FIELD OF THE INVENTION

This invention relates to cross-polarization, nuclear resonance spectroscopy and, more particularly, to an optical calibration apparatus for calibrating and reproducing spinning angles in cross-polarization, nuclear magnetic resonance spectroscopy applications.

BACKGROUND OF THE INVENTION

Cross-polarization, nuclear magnetic resonance spectroscopy experiments are performed by spinning a sample material in an applied magnetic field. As a result of the interaction between the sample and the magnetic field, the sample emits electromagnetic signals at characteristic resonant frequencies. The resonant frequency depends on the strength of the magnetic field, and the nuclear and structural properties of the test sample. The signals so produced are collected and processed using spectrum analysis instrumentation to obtain a plot of signal intensity versus frequency, i.e., an intensity-frequency spectrum.

Resolution is the process of distinguishing between discrete signals produced from a single sample. The maximum resolution, i.e., greatest distinction between signals, is achieved, in an exemplary amendment, by spinning a test sample several thousand times a second at a 54.7° angle with respect to the magnetic field. This angle is known as the "magic angle."

The usual method of attaining a reference magic angle is to observe bromine-79 spectral signals emitted from a spinning sample of potassium bromide. When a characteristic peak signal of the sample is observed, the angular position with respect to the magnetic field is noted. This angular position must be accurately reproduced for subsequent test samples. Since overlap of many spectral lines can occur at small angular variances from the magic angle, accurate reproducibility is a critical factor.

Magic angle calibration is conventionally performed by either reproducing the angle mechanically or mixing a test sample with potassium bromide and observing bromine-79 signals to reset the angle. However, both of these approaches have certain disadvantages which will be described below.

Mechanical calibration systems generally use a mechanical "stop" to reproduce a reference angle. In particular, after observing a bromine-79 reference signal, the spectroscopist sets a mechanical stop which is attached to the angular adjustment mechanism of the sample holder. The stop prevents the sample from being positioned past the magic angle. In order to test a subsequent sample, the holder is rotated to a 90° position, the reference material is replaced by a test sample, and the holder is rotated back to the mechanical limit of the stop.

One serious disadvantage of the mechanical stop calibration procedure is a lack of accuracy. This approach does not guarantee angular reproducibility of ±0.1°, which is the measure of accuracy required to prevent serious signal degradation for certain test samples. Moreover, mechanical adjustment and calibration devices commonly experience problems such as gear backlash, hysteresis and long-term slippage or wandering of set positions. These problems cause variations in the angular position of a sample each time the holder is repositioned, and such variations significantly degrade reproducibility.

As noted above, an alternative calibration procedure is to mix potassium bromide with the test sample and set the magic angle by observing bromine-79 spectral lines. However, while this approach ensures accurate attainment of the magic angle for each experiment, the procedure reduces the volume of the tested sample which, in turn, extends the time required to perform the experiment. An additional disadvantage is that some test samples should not be mixed with foreign materials, such as potassium bromide.

A common disadvantage of both procedures described above is that neither alternative allows small angular deviations from the magic angle to be accurately reproduced and also completed within a short time frame. Small angular deviational experiments are typically performed to elicit additional spectral information from a test sample.

SUMMARY OF THE INVENTION

In accordance with the present invention, an apparatus is provided for reproducing magic angles in cross-polarization, nuclear magnetic resonance spectroscopy experiments which overcomes the disadvantages of the prior art discussed above.

Generally speaking, the invention concerns an optical calibration apparatus wherein the angular position of a spectroscopic test sample in a cross-polarization probe is viewed by an experimenter or other operator of the apparatus and is noted using reference markings on a viewing reticle, in order to enable the operator to return the sample to the same angular position during subsequent experiments.

The optical calibration apparatus in accordance with the present invention eliminates problems commonly associated with mechanical calibration systems, such as gear-train backlash, hysteresis, and mechanical stop slippage or wandering. Further, the invention eliminates the need to mix potassium bromide with test samples, since the reference magic angle can be accurately reproduced for subsequent experiments without the need for mixing materials. As a result, the present invention significantly reduces magic angle reproducibility errors that result from mechanical calibrations as well as the average time needed to perform magic angle experiments.

Thus, it is an object of the present invention to provide a new and improved apparatus for reproducing magic angles in cross-polarization, nuclear magnetic resonance spectroscopy experiments.

It is still another object of the present invention to provide a new and improved optical calibration apparatus for reproducing magic angles in cross-polarization, nuclear magnetic resonance spectroscopy experiments.

According to a preferred embodiment of the invention, an apparatus is provided for spinning "magic angles" to be reproduced in nuclear magnetic resonance spectroscopy application, the apparatus comprising: a spinning angle cross-polarization probe including a sample holder for holding spinning test samples, the sample holder including a reference mark thereon; positioning means connected to the sample holder for enabling the angular position of the sample holder to be varied; and viewing means, including at lest one reference, for permitting viewing of the reference mark of the sample holder, relative to the at least one reference, for the position of the sample holder corresponding to the magic angle of the sample so that the sample holder can be larger returned to the position corresponding to the magic angle of the sample.

Preferably, the viewing means comprises a magnifying device, and the apparatus further comprising means for adjustably mounting the magnifying device to adjust the focus thereof relative to the sample holder. This mounting means advantageously comprises a thin-walled tube having a bottom end connected to the probe and fitting snugly around an aperture in the probe through which the sample holder can be viewed, the magnifying device being received in the top end of the tube and being slidably mounted therein to provide focussing of the magnifying device on the reference mark.

Preferably, the apparatus further comprises means for illuminating the reference mark in order to enhance viewing of the reference mark. The illuminating means advantageously comprises at least one fiber optic cable connected at one end to an external light source. In a preferred embodiment, two fiber optic cables are used to avoid the effect of shadows. The fiber optic cables are preferably arranged so as to extend along opposite sides of the magnifying device and are disposed so as to transmit light through the aperture in the probe onto the reference mark on the sample holder. The fiber optic cables are advantageously connected to bulkhead connectors which are affixed to the top outside wall of the tube and which connect the fiber optic cables to the external light source.

In a preferred embodiment, the magnifying device comprises a 40-power, long focal length macroscope.

Other objects, features and advantages of the invention will be set forth or apparent from the description of a preferred embodiment of the invention which follows.

BRIEF DESCRIPTION OF THE DRAWINGS

FIG. 2 is a side elevational view of the optical calibration apparatus of FIG. 1; and FIG. 3 is an enlarged top view of an eyepiece with reticle, including a schematic representation of the edge of the sample holder of FIGS. 1 and 2.

DESCRIPTION OF A PREFERRED EMBODIMENT

Figure 1:
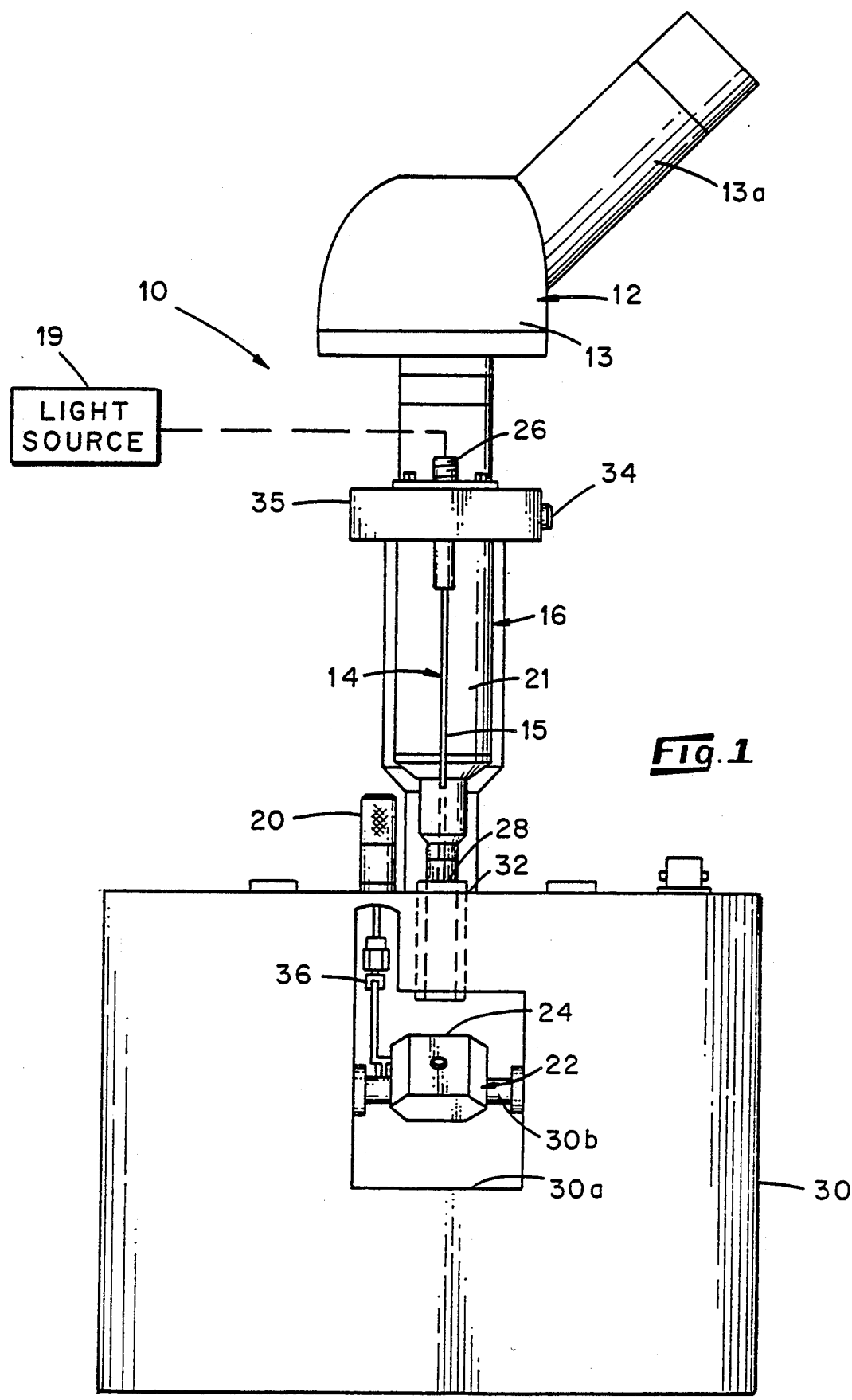
FIG. 1 is a front elevational view of an optical calibration apparatus in accordance with a preferred embodiment of the present invention.

Referring to the drawings, a spinning angle calibration system in accordance with a preferred embodiment of the invention is shown which is generally denoted 10 and comprises three basic component assemblies: a macroscope assembly 12, a fiber optical cable assembly 14, and a cross-polarization illumination adapter assembly 16.

The macroscope assembly 12 basically comprises a 40-power, long focal length macroscope 13 including an eyepiece 13a which is used by an operator to view the edge 24 of a sample holder 22 used to contain or support the sample under test. The basic macroscope 13 is of conventional construction and may, for example, comprise a Bausch and Lomb Macroscope Model No. 31-29-54-41. The sample holder 22 is mounted in an aperture or opening 30a in the center of a generally rectangular spinning angle cross-polarization probe 30 and rotates about a shaft 30b mounted within opening 30a and extending transverse to the axis of macroscope 13. As illustrated in FIG. 3, the macroscope 13 contains a reticle 18 having a large number (e.g. 150) of minor graduations 18a which are evenly spaced 0.001 inches apart and a further number of major graduations 18b which are evenly spaced 0.005 inches apart.

The fiber optic cable assembly 14 comprises two, typically 600 micrometer, solid core fiber optic cables 15 and 17 (see FIG. 2). An external fiber optic light source, which is indicated schematically at 19 and which provides a variable intensity light, is connected to each of two bulkhead fiber optic connectors 26. The lower ends of the fiber optic cables 15 and 17 are held in place adjacent to the top of probe 30 by a retaining ring 28. The light from the fiber optic source 19 is transmitted through the two bulkhead connectors 26 and the fiber optic cables 15 and 17 and is emitted from the ends of the latter so as to illuminate the edge 24 of the sample holder 22. Two fiber optic cables 15 and 17 are preferably used rather than a single cable in order to eliminate shadows.

The cross-polarization illumination adapter assembly 16 comprises a tube 21 which holds the macroscope 13 in place over a sample access port 32 in probe 30. As illustrated, tube 21 is shaped to conform to the shape of the downwardly depending portion of macroscope 13. The opening provided by port 32 is used as a conduit to provide illumination of, and viewing access through the macroscope 13 to, the edge 24 of the sample holder 22. A focal length locking screw 34, mounted in a support ring 35 which also supports connectors 26 and cables 15 and 17, fixes the position of the macroscope 13 inside the cross-polarization illumination adapter tube 21 when the macroscope 13 is focussed on the edge 24 of the sample holder 22. The focussing adjustment is made by sliding the macroscope 13 up or down within the illumination adapter tube 21. A spinning angle adjustment knob 20 is mechanically connected by a suitable pivoting linkage 36 to the sample holder 22. Linkage 36 acts to provide rotation of shaft 30b to adjust the position of sample holder 22 and can take a number of different conventional forms.

In operation, the holder 22 is rotated, using adjustment knob 20, about shaft 30b, until the spinning magic angle of the sample is reached. When the magic angle is reached, the operator looks through the eyepiece 13a of macroscope 13 and observes the position of the reference mark 24a located on the sample holder edge 24 with respect to the intersection thereof with a graduation or graduations (18a, 18b) on the reticle 18. This coordinate position is the reference point or position for the magic angle of that sample. The operator can then adjust the sample holder 22 to other angles and reproduce the magic angle of the sample by returning to the coordinate reference point.

Although the invention has been described relative to an exemplary embodiment thereof, it will be understood by those skilled in the art that variations and modifications can be effected in this embodiment without departing from the scope and spirit of the invention.

We claim:

1. An apparatus for enabling reproducing of spinning magic angles in nuclear magnetic resonance spectroscopy applications, said apparatus comprising:
   (a) a spinning angle cross-polarization probe including a sample holder means for holding spinning test samples, said holder means including a reference mark thereon;

(b) positioning means connected to said sample holder means for enabling the angular position of the sample holder means to be varied; and (c) viewing means, including at lest one reference, for permitting viewing of the reference mark of the sample holder means relative to said at least one reference for the position of the sample holder means corresponding to the magic angle of the sample so that the sample holder means can later be returned to said position corresponding to the magic angle of the sample.

2. An apparatus as claimed in claim 1, wherein said viewing means comprises a magnifying device, said apparatus further comprising means for adjustably mounting the magnifying device.

3. An apparatus as claimed in claim 2 further comprising means for illuminating the reference mark in order to enhance viewing of the reference mark.

4. An apparatus as claimed in claim 3, wherein said mounting means comprises a thin-walled tube having a bottom end connected to the probe and fitting snugly around an aperture in said probe through which the sample holder means can be viewed, said magnifying device being received in the top end of the tube and being slidably mounted therein to provide focussing the magnifying device on the reference mark.

5. An apparatus as claimed in claim 4, wherein said illuminating means comprises at lest one fiber optic cable connected at one end to an external light source.

6. An apparatus as claimed in claim 5, wherein said illuminating means comprises two of said fiber optic cables.

7. An apparatus as claimed in claim 6, wherein said fiber optic cables extend along opposite sides of the magnifying device and are disposed so as to transmit light through said aperture onto the reference mark on the sample holder means.

8. An apparatus as claimed in claim 4, wherein said fiber optic cables are connected to bulkhead connectors, affixed to the top outside wall of the tube, for connecting said fiber optic cables to said external light source.

9. An apparatus as claimed in claim 2, wherein said magnifying device comprises a 40-power, long focal length macroscope.

10. An apparatus for reproducing spinning magic angles in nuclear magnetic resonance spectroscopy experiments, said apparatus comprising:

(a) a spinning angle cross-polarization probe comprising a probe body and including a holder means for spinning test samples, said holder means being mounted in an opening in the probe below an aperture in the top wall of the probe body, said holder means including a reference mark on one edge which can be viewed through the aperture;

(b) means connected to the sample holder means for varying the angular position of the sample holder means;

(c) magnifying means, containing an eyepiece including an optical reticle, mounted above the probe and positioned over the aperture in the probe body so as to permit the reference mark to be viewed through the eyepiece of the magnifying device;

(d) mounting means for adjustably mounting the magnifying device in position above the aperture to permit focussing of the magnifying device on the reference mark;

(e) illuminating means for illuminating the reference mark to enhance viewing of the reference mark and the reticle simultaneously through the magnifying means so that a reference position of the holder means can be noted and later reproduced.

11. An apparatus as claimed in claim 10, wherein said mounting means comprises a thin-walled, hollow cylindrical tube having a bottom end connected to the probe and fitted into said aperture, said magnifying device being received in the top end of the tube and being slidably mounted therein to provide focussing the magnifying device on the reference mark.

12. An apparatus as claimed in claim 9, wherein said illuminating means comprises at least one fiber optic cable connected at one end to an external light source.

13. An apparatus as claimed in claim 10, wherein said illuminating means comprises two of said fiber optic cables connected to said external light source.

14. An apparatus as claimed in claim 13, wherein said fiber optic cables extend along opposite sides of the magnifying device and are disposed so as to transmit light through said aperture onto the reference mark on the sample holder means.

15. An apparatus in accordance with claim 14, wherein said fiber optic cables are connected to bulkhead connectors, affixed to the top outside wall of the tube, for connecting fiber optical cables to said external light source.

16. An apparatus in accordance with claim 9, wherein said magnifying device comprises a 40-power, long focal length macroscope.

* * * * *